US009837607B2

United States Patent
Cario et al.

(10) Patent No.: US 9,837,607 B2
(45) Date of Patent: Dec. 5, 2017

(54) USE OF CENTROSYMMETRIC MOTT INSULATORS IN A RESISTIVE SWITCHED MEMORY FOR STORING DATA

(71) Applicants: CNRS—Centre National De La Recherche Scientifique, Paris (FR); Universite De Nantes, Nantes (FR)

(72) Inventors: Laurent Cario, Nantes (FR); Etienne Janod, La Chapelle sur Erdre (FR); Benoit Corraze, Carquefou (FR); Marie-Paule Besland, Orvault (FR); Vincent Guiot, Didcot (GB)

(73) Assignees: CNRS—CENTRE NATIONAL DE LA RECHERCHE SCIENTIFIQUE, Paris (FR); UNIVERSITE DE NANTES, Nantes (FR)

( * ) Notice: Subject to any disclaimer, the term of this patent is extended or adjusted under 35 U.S.C. 154(b) by 0 days.

(21) Appl. No.: 14/391,994

(22) PCT Filed: Apr. 10, 2013

(86) PCT No.: PCT/EP2013/057500
§ 371 (c)(1),
(2) Date: May 18, 2015

(87) PCT Pub. No.: WO2013/153120
PCT Pub. Date: Oct. 17, 2013

(65) Prior Publication Data
US 2015/0255714 A1    Sep. 10, 2015

(30) Foreign Application Priority Data

Apr. 10, 2012  (FR) ...................................... 12 53275

(51) Int. Cl.
*H01L 45/00* (2006.01)
*G11C 13/00* (2006.01)

(52) U.S. Cl.
CPC ........ *H01L 45/142* (2013.01); *G11C 13/0002* (2013.01); *G11C 13/0007* (2013.01);
(Continued)

(58) Field of Classification Search
CPC ..... H01L 45/142; H01L 45/14; H01L 45/141; H01L 45/143; H01L 45/146
See application file for complete search history.

(56) References Cited

U.S. PATENT DOCUMENTS

2008/0158937 A1*  7/2008 Jung ................... G11C 11/24
                                                                  365/149
2009/0231083 A1    9/2009 Hosoi et al.

OTHER PUBLICATIONS

Kim et al., "Temperature dependence Mott transistion in VO2 and programmbable critical temerature sensor," arXiv:cond-mat/0609033v1 Sep. 2006.*

(Continued)

*Primary Examiner* — Matthew Reames
(74) *Attorney, Agent, or Firm* — David D. Brush; Westman Champlin & Koehler, P.A.

(57) ABSTRACT

A material belonging to the family of centrosymmetric Mott insulators is used as an active material in a resistively switched memory for storing data. The material is placed between two electrical electrodes, by virtue of which an electric field of a preset value is applied in order to form, by way of an electron avalanche effect, an elementary information cell that has at least two logic states.

20 Claims, 6 Drawing Sheets

(52) U.S. Cl.
CPC .......... *G11C 13/0014* (2013.01); *H01L 45/04* (2013.01); *H01L 45/1253* (2013.01); *H01L 45/14* (2013.01); *H01L 45/141* (2013.01); *H01L 45/143* (2013.01); *H01L 45/146* (2013.01); *H01L 45/147* (2013.01)

(56) References Cited

OTHER PUBLICATIONS

Kunes et al., "Metal-insulator transition in NiSi(2-x)Se(x)," Phys. Rev. B 81 035122 Jan. 2010.*

Dumm et al. "Bandwidth-controlled Mott transition in κ-(BEDT-TTF)2Cu[N(CN)2]BrxCl1—x: Optical studies of correlated carriers," arXiv:0203.0244v1, 2009.*

Guiot et al., "Control of the Electronic Properties and Resistive Switching in the New Series of Mott Insulators GaTa 4 Se 8-y Te y (0<=y<=6.5)", Chemistry of Materials, vol. 23, No. 10, May 24, 2011 (May 24, 2011), pp. 2611-2618, XP055042641.

Cario et al., "Electric-Field-Induced Resistive Switching in a family of Mott Insulators: Towards a New Class of RRAM Memories", Advanced Materials, vol. 22, No. 45, Oct. 18, 2010 (Oct. 18, 2010), pp. 5193-5167, XP055042723.

Souchier et al., "Resistive Switching Driven by Electric Field in the Mott Insulators AM4X8 (A=Ga, Ge; M=V, Nb, Ta; X=S, Se): Towards a New Class of Non-Volatile RRAM Memory" Memory Workshop (IMW) 2011, 3rd IEEE International, IEEE May 22, 2011 (May 22, 2011), pp. 1-4, XP031947206.

Imada et al., "Metal-Insulator Transitions", Reviews of Modern Physics, vol. 70, No. 4, pp. 1039-1263 (1998).

International Search Report and Written Opinion dated May 6, 2013 for corresponding International Application No. PCT/EP2013/057500, filed Apr. 10, 2013.

French Search Report and Written Opinion dated Nov. 5, 2012 for corresponding French Application No. 1253275, filed Apr. 10, 2012.

International Preliminary Report on Patentability and English translation of the Written Opinion dated Oct. 14, 2014 for corresponding International Application No. PCT/EP2013/057500, filed Apr. 10, 2013.

Imada et al., "Metal-Insulator Transitions", Reviews of Modern Physics, vol. 70, No. 4,pp. 1039-1263 (1998).

Lo Vecchio et al., "Optical properties of V2O3 in its whole phase diagram", Article, 2015, 9 pages, Physical Review B 91, 155133 (2015), © 2015 American Physical Society.

* cited by examiner

Figure 6a          Figure 6b

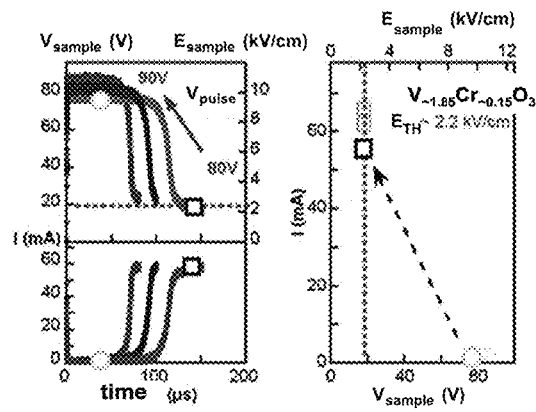
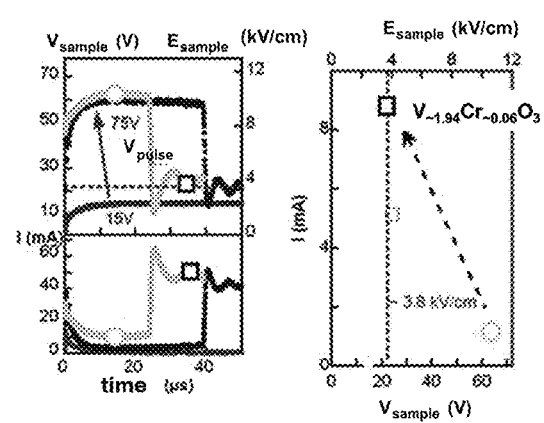
Figure 7c
Figure 7d
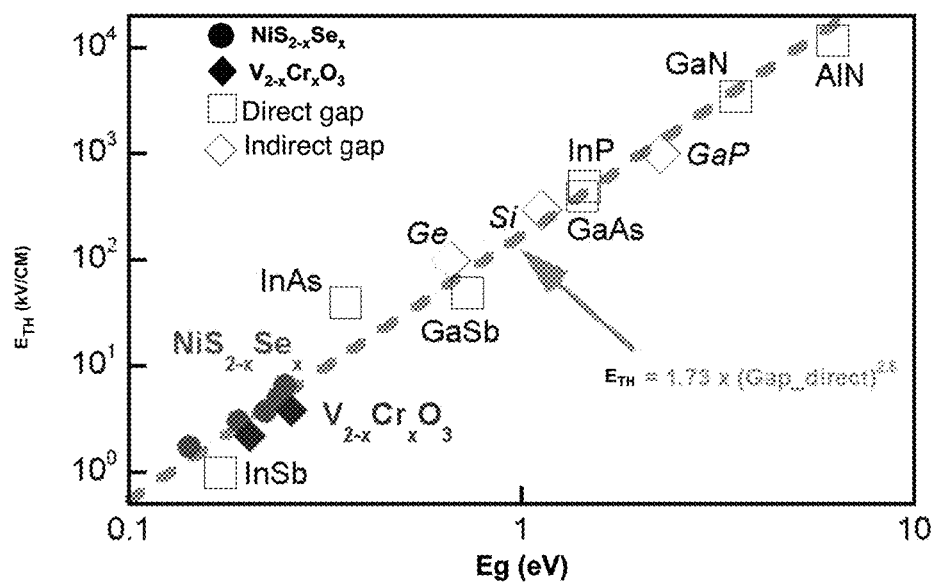
Figure 7e

USE OF CENTROSYMMETRIC MOTT INSULATORS IN A RESISTIVE SWITCHED MEMORY FOR STORING DATA

1. CROSS-REFERENCE TO RELATED APPLICATIONS

This Application is a Section 371 National Stage Application of International Application No. PCT/EP2013/057500, filed Apr. 10, 2013, the content of which is incorporated herein by reference in its entirety, and published as WO 2013/153120 on Oct. 17, 2013, not in English.

2. FIELD OF THE INVENTION

The field of the invention is that of memories for storing data.

More specifically, the invention relates to a compound forming the active material of a resistive switched memory, especially for the electronic storage of data.

The invention can be applied especially but not exclusively to RRAM (Resistive Random Access Memory) type memories and to MEMRISTORs.

3. TECHNOLOGICAL BACKGROUND

The current technology of non-volatile memories is dominated by Flash memories which are used in numerous large-scale consumer applications (for example in digital cameras, USB sticks, etc). They are rewritable, semi-conductor memories.

The technological development of these Flash memories however is facing a certain number of obstacles. Their service life is limited, their writing and erasure times are relatively great (over 10 μs and 1 ms respectively) and they require high voltages (over 10 V) in order to store data. Besides, this technology is reaching its limits in terms of size reduction.

Recently, RRAMs and MEMRISTORs have appeared as alternative solutions to Flash memories. Indeed, in RRAMs and MEMRISTORs, very short electrical pulses, generally of the order of 100 ns, generate a variation in the electrical resistance of a simple device constituted by two electrodes separated by an active material.

The term "active material" is understood here below in the description to mean a material capable of taking at least two distinct states of electrical resistance through the application of electrical pulses.

There are different types of active materials known in the prior art. These active materials, which are incorporated into RRAMs or MEMRISTORs, are for example: NiO, $TiO_2$, $SrTiO_3$.

Now, at present, these memories still undergoing experimentation as the underlying physical/chemical phenomena are as yet poorly understood and therefore poorly mastered. The industrial-scale application of such memories therefore raises real difficulties. Indeed, these memories do not entirely meet the requirements fixed by the ITRS (International Technology Roadmap for Semiconductors), especially in the matter of switching voltage, temperature, memory window, service life and integration.

4. SUMMARY OF THE INVENTION

An exemplary embodiment of the present invention relates to the use of a material belonging to the family of centrosymmetric Mott insulators as an active material of a resistive switching memory for storing data, the material being placed between two electrical electrodes by means of which an electrical field of a predetermined value is applied to form an elementary information cell by electronic avalanche effect in the material, this elementary information cell containing at least two logic states.

In experiments conducted on compounds having current-voltage non-linearities, the inventors have indeed surprisingly discovered the existence of a phenomenon of resistive switching induced by electrical pulses in the family of centrosymmetric Mott insulators. The successive application of electrical pulses makes it possible to obtain variations, in a volatile or non-volatile manner, in the resistance of these materials between at least two distinct resistance states, and to do so reversibly.

Mott insulators are a class of materials, the electronic structure of which results from the presence of strong electrostatic repulsion between electrons (these are also called materials with strong electron correlation). The special electronic structure of this family of materials is described more lengthily here below in this document with reference to FIGS. 1 to 3. It is well known from the general knowledge of those skilled in the art that these materials have an energy band gap at the Fermi level.

Among Mott insulators, it is possible to distinguish those that have a crystallographic structure with an inversion center and are known as centrosymmetric, and those that have a crystallographic structure without an inversion center and are known as non-centrosymmetric.

The resistive switching behavior (also called resistive transition), which was initially unexpected in research on this special class of centrosymmetric Mott insulators, results from a local modification of the electronic structure of these materials due to the effect of the electrical field applied to them. Indeed, the effect of the electrical field on these materials creates a dielectric breakdown by electron avalanche effect, the consequence of which is to locally destroy the Mott insulator state and restore a metal state.

The term "electron avalanche" is generally understood here to mean an electronic phenomenon appearing in the form of an increase in the number of electron-hole pairs within the material considered. This phenomenon of electronic avalanche is well known in the field of classic centrosymmetric semiconducting and band-insulating materials but was hitherto unknown for Mott insulators. The phenomenon appears in the form of a sudden change in the state of electrical resistance of the material subjected to an electrical field of a predetermined value.

Since the material is placed between two electrical electrodes, such a structure makes it possible to constitute a logic element and more specifically an elementary storage cell that can take at least two states, a state of high electrical resistance, a state of low electrical resistance and, possibly, states of intermediate resistance, leading to the possibility of writing at least two logic states in the material. In addition, the simplicity of such a structure increases the quantity of information stored per unit of volume as compared with the more complex structures of the Flash memories of the prior art. Finally, as shall be seen here below, the inventors have shown that it is possible, at ambient temperature, to generate switching cycles between two resistive states reproducibly, without deterioration of material, and that this feature can be used to make a rewritable memory.

The current/voltage characteristics observed for Mott insulators in the context of the invention make it possible to envisage industrial-scale applications for the use of these materials as active materials in RRAM or MEMRISTOR type rewritable memories for example.

According to a first advantageous embodiment, the material belongs to a sub-family of inorganic compounds.

In particularly advantageous way, the material belongs to a sub-family of inorganic compounds meeting the formula $NiS_{2-x}Se_x$, with $0.0 \leq x \leq 0.59 0 \leq x \leq 1$.

In particularly advantageous way, the material belongs to a sub-family of inorganic compounds meeting the formula $V_{2-x}M_xO_3$, with $0.02 \leq x \leq 0.50 \leq x \leq 1$, and with M comprising at least one of the following elements: Ti, Cr, Fe, Al or Ga. It must be noted that M can be a combination of these elements.

According to a second advantageous embodiment, the material belongs to a sub-family of organic compounds.

According to an advantageous approach of the invention, the chemical composition of the material used is chosen so as to set an electrical field threshold value beyond which the material switches over from a first state of electrical resistance to one or more different states of electrical resistance to form an elementary information cell containing at least two logic states.

It is thus possible to adjust the threshold value of the electrical field making it possible to prompt the switching of the material depending on the chemical engineering behind the compound used as an active material. According to one advantageous characteristic, the chemical composition of the compound is chosen so that the threshold value of the electrical field is relatively low, for example below 10 kV/cm and preferably below 2 kV/cm.

5. LIST OF FIGURES

Other features and advantages of the invention shall appear more clearly from the following description, given by way of an indicative and non-exhaustive example and from the appended drawings, of which:

FIGS. 1 and 2 present diagrams of the electronic structure of a metal and of a semi-conductor as obtained in the context of band theory;

FIGS. 3*a* and 3*b* present diagrams of the electronic structure taking account of the Coulomb repulsion for two types of Mott insulators, Mott-Hubbard insulators on the one hand (FIG. 3*a*) and charge transfer insulators on the other hand (FIG. 3*b*);

FIGS. 3*c* and 3*d* present diagrams of the electronic structure of n-doped Mott insulators (FIG. 3*c*) or p-doped Mott insulators (FIG. 3*d*), also called correlated metals;

Figure 5:
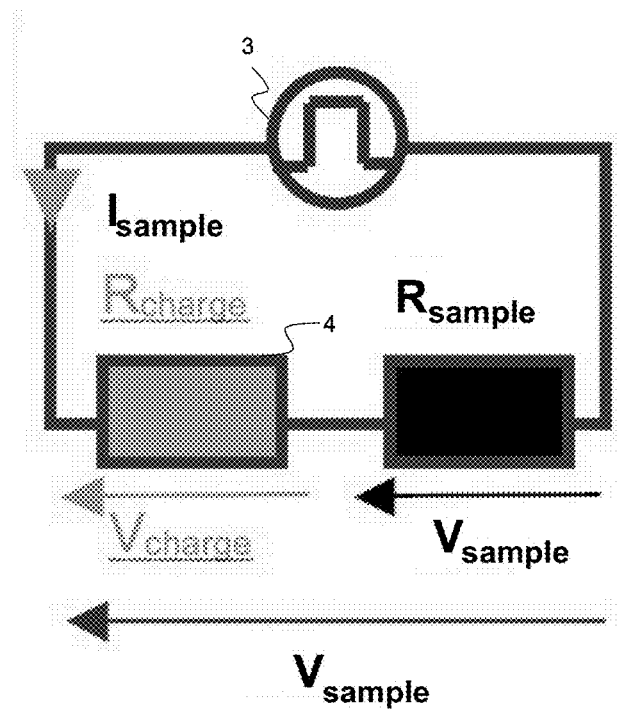
FIG. 5 is a diagram of an experimental electrical assembly used in the context of FIG. 4 for the application of voltage pulses and for observing current-voltage non-linearities of the active material.
Figure 6C:
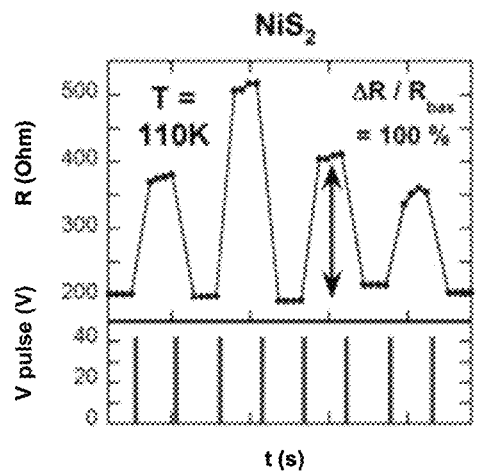
Figure 6C:
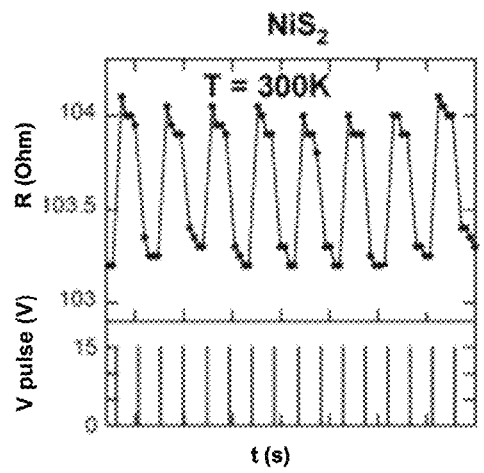
Figure 6C:
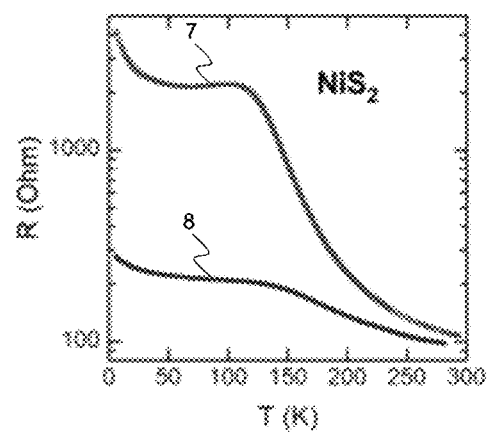
Figure 6D:
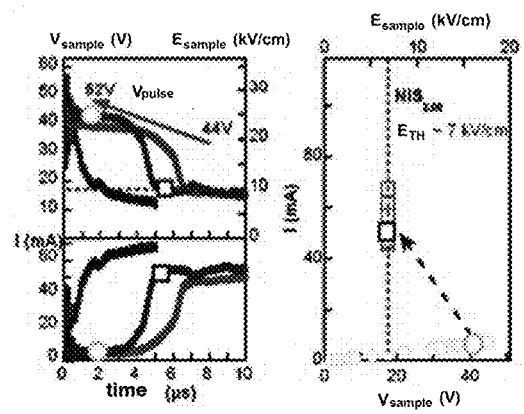
Figure 6E:
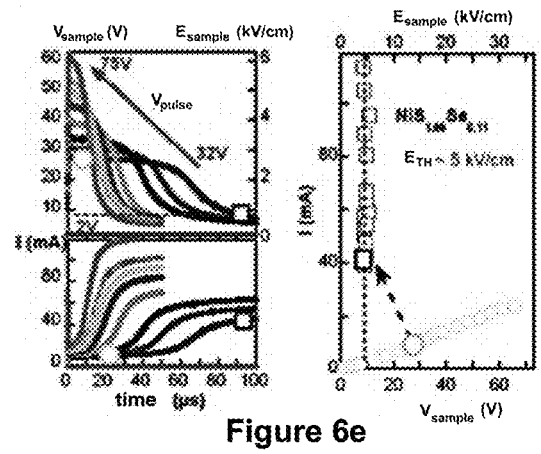
Figure 6F:
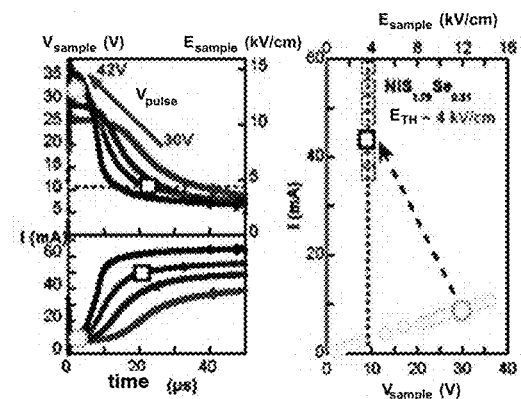
Figure 6G:
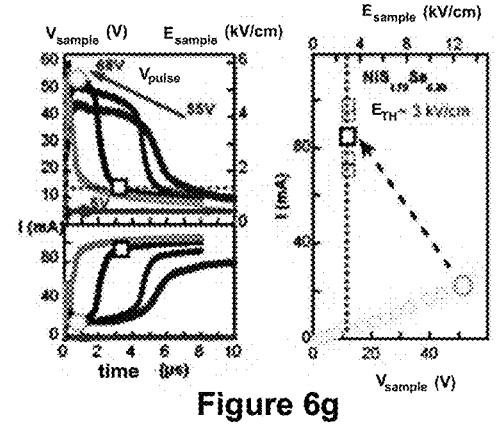
Figure 6H:
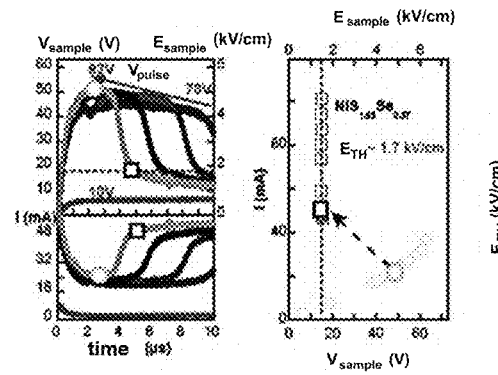
Figure 6I:
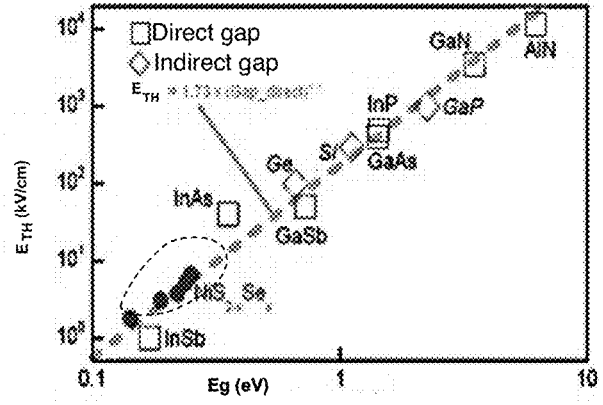
Figure 7A:
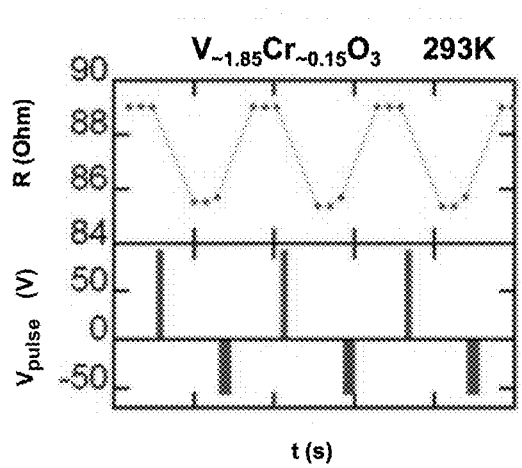
Figure 7B:
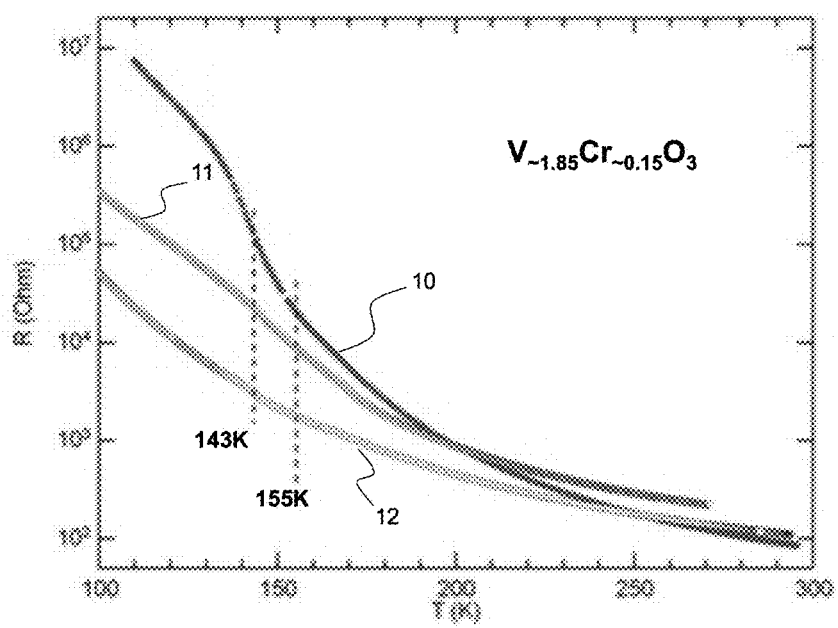

FIGS. 6*a* to 6*h* show a set of experimental curves obtained with a first example of an active material incorporating the assembly of FIG. 5 and meeting the formula $NiS_{2-x}Se_x$:

FIGS. 6*a* and 6*b* graphically illustrate the phenomenon of non-volatile and reversible resistive switching induced by voltage pulses, obtained for the compound $NiS_2$ at 110K and 300K respectively;

FIG. 6*c* represents the progress in of the resistance of the compound $NiS_2$ as a function of the temperature before and after the switching of the sample;

FIGS. 6*d* to 6*h* represent the progress in time of the voltage and of the current measured at the terminals of the compounds $NiS_2$, $NiS_{1.89}Se_{0.11}$, $NiS_{1.79}Se_{0.21}$, $NiS_{1.70}Se_{0.30}$, $NiS_{1.63}Se_{0.37}$, as well as the corresponding current-voltage characteristics;

FIG. 6*i* illustrates the progress of the threshold electrical field prompting a resistive switching for the compounds illustrated in FIGS. 6*d* to 6*h* as a function of the band-gap energy;

FIGS. 7*a* to 7*e* show a set of experimental curves obtained with a second example of an active material incorporating the assembly of FIG. 5 and meeting the formula $V_{2-x}Cr_xO_3$:

FIG. 7*a* graphically illustrates the phenomenon of non-volatile and reversible resistive switching induced by voltage pulses obtained for the compound $V_{\sim 1.85}Cr_{\sim 0.15}O_3$ at 293K;

FIG. 7*b* show the progress of the resistance of the compound $V_{\sim 1.85}Cr_{\sim 0.15}O_3$ as a function of the temperature before and after switching of the sample;

FIGS. 7*c* and 7*d* represent the progress in time of the voltage and of the current measured at the terminals of the compounds $V_{\sim 1.85}Cr_{\sim 0.15}O_3$ at 155 K (in the paramagnetic Mott insulator state) and $V_{\sim 194}Cr_{\sim 0.06}O_3$ at 145 K (in the antiferromagnetic Mott insulator state) as well as the corresponding current-voltage characteristics;

FIG. 7*e* illustrates the progress of the threshold electrical field prompting a resistive switching for the compounds illustrated in FIGS. 7*c* to 7*d* as a function of the band-gap energy.

6. DETAILED DESCRIPTION

In all the figures of the present document, identical elements and steps are designated by a same numerical reference.

As discussed here above, the principle of the invention lies in the astute use of a material belonging to the family of centrosymmetric Mott insulators as an active material in a memory for storing data. The inventors have indeed brought to light the existence, in this family of materials, of a phenomenon of reversible resistive switching induced by electrical pulses. In particular, the inventors have surprisingly discovered that this phenomenon is closely linked to the particular electronic properties of these materials. Indeed, when an electrical field of a predetermined value is applied to one of these materials, the electronic structure of said material is thereby modified: research conducted in recent years shows that resistive switching is initiated by a phenomenon of electronic origin comparable to the electron avalanche phenomenon known in semi-conductors but hitherto unknown in this family of materials. This result is remarkable since it enables a novel use of the family of centrosymmetric Mott insulators as active materials in data storage memories of the RRAM or MEMRISTOR type for example.

Mott insulators constitute a class of materials, the electronic structure of which results from the presence of strong Coulomb repulsion between electrons. The electronic structure of the solids is generally described in the context of band theory which disregards these Coulomb repulsions between electrons situated on the same site (atoms, atom aggregates or molecules). This theory is appropriate for metals and semi-conductors (or band insulators) but does not accurately describe the case of Mott insulators. According to this theory, the creation of crystalline orbitals in a solid forms a succession of energy bands accessible to the electrons.

Figure 1:
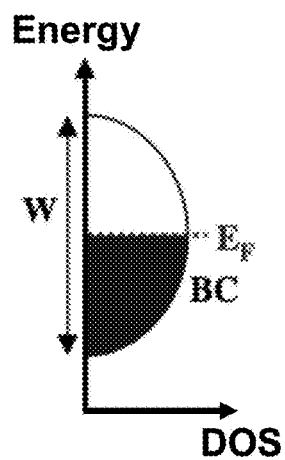
Figure 2:
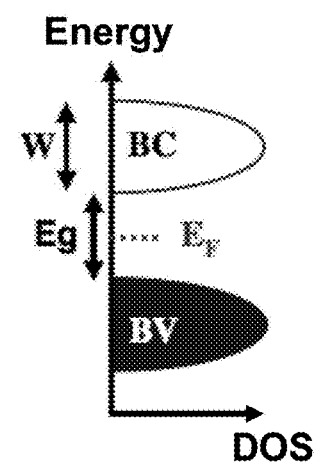

FIGS. 1 and 2 propose a schematic view of the density of the electron states or DOS ("Density Of States") for a metal and a semi-conductor (or a band insulator) respectively. For metals, the highest energy band occupied is partially filled. The Fermi level (denoted as $E_F$ and also called the electron chemical potential), which, in this case, corresponds to the last electron level occupied, is therefore placed in the middle of this energy band. The possibility, offered to electrons situated at the Fermi level, of being capable of gaining energy, i.e. of being accelerated under the effect of an electrical field, gives these compounds the capacity to be good conductors of electricity. Conversely, semiconductors (and more generally band insulators) possess an electronic structure formed by energy bands that are completely filled or empty. In these compounds, the Fermi level $E_F$ is placed in the energy band gap, of a width $E_g$, between the top of the last full band (generally called the valence band, denoted as VB in the figure) and the bottom of the first empty band (generally called the conduction band, denoted as CB in the figure). The width of the conduction band is denoted as W. In the case of semi-conductors, it is well known that the electrons situated at the Fermi level cannot be accelerated by an electrical field since they cannot gain energy. These compounds are therefore poor electrical conductors, and are called electrical insulators.

Figure 3A:
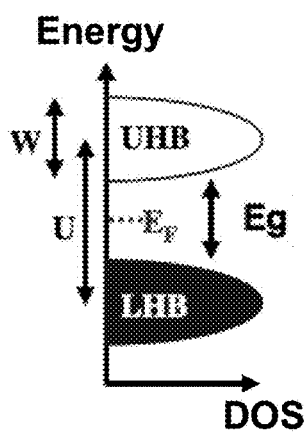
Figure 3B:
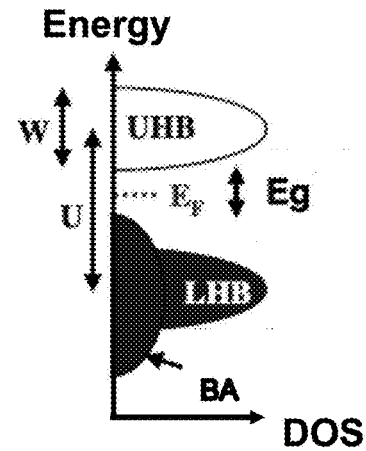

As a rule, as illustrated in FIGS. 3a and 3b, Mott insulators are differentiated from band insulators in the sense that they are compounds which, in band theory, have a band of a width W at the Fermi $E_F$ level that is half filled (with only one electron in a band that is capable of receiving two electrons of opposite spins) or partially filled. According to band theory, the compounds with half-filled band should possess a metallic character. However, when the electrostatic repulsion energy between electrons situated on a same site (called the Hubbard energy U) is taken into account, the half-filled band is separated into one occupied sub-band LHB ("Lower Hubbard Band") and one empty sub-band UHB ("Upper Hubbard Band"). This leads to the opening of an energy band gap of energy width $E_g$ at the Fermi level $E_F$. As illustrated in FIGS. 3a and 3b, the opening of this band gap at the Fermi level therefore gives the Mott insulators electrically insulating behavior. This is well known to those skilled in the art as indicated more generally in the document by "Masatoshi Imada et al., *Metal-insulator transitions*, Reviews of Modern Physics, Vol. 70, No. 4, pages 1039-1263 (1998)".

This concept of a Mott insulator with only one electron situated on a band can be extended to the case of multiband Mott insulators possessing an integer number of electrons situated on several bands.

More particularly, the family of Mott insulators (with one or more bands) is constituted by two sub-classes, on the one hand Mott-Hubbard insulators (FIG. 3a) for which the energy band gap ($E_g$) opens between the LHB and UHB sub-bands, and, on the other hand, a charge transfer insulator (FIG. 3b) for which the energy band gap ($E_g$) opens out between an anionic band, denoted as AB, (such as for example Oxygen 2p, Sulfur 3p or Selenium 4p), the top of which is situated at an energy level higher than that of the top of the LHB sub-band, and the UHB sub-band.

Figure 3C:
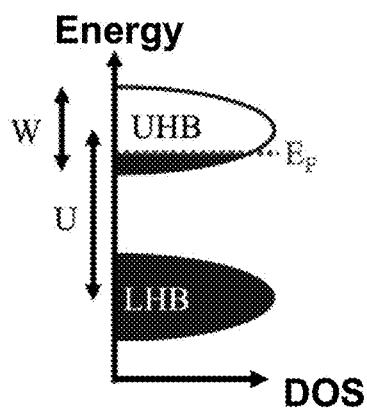
Figure 3D:
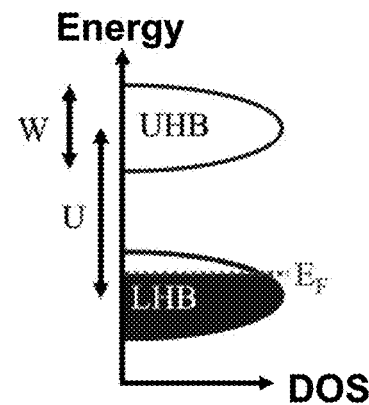

FIGS. 3c and 3d show a schematic representation of the density of the electron states of the correlated metals. These materials are sometimes loosely called Mott insulators. Indeed, a Mott insulator can be doped by an appropriate chemical modification in order to add electrons in the UHB sub-band or remove electrons from the LHB sub-band. In this case, the Mott insulator is called n-doped or p-doped respectively. For these n-doped or p-doped materials, the Fermi level $E_F$ is placed in the UHB sub-band or LHB sub-band respectively. The n-doped or p-doped insulators are therefore metals that do not have any electrically insulating phase unlike the Mott insulators classically used in the context of the invention. Those skilled in the art will therefore understand that these metal compounds are not considered to be Mott insulators as understood in the invention. Only the Mott insulators (see FIGS. 3a and 3b) possessing an energy band gap $E_g$ at the Fermi level $E_F$, show an electrically insulating character. As illustrated here below, with reference to FIGS. 4, 5, 6a to 6i, 7a to 7e, such Mott insulators (which possess an energy band gap $E_g$ at the Fermi level $E_f$) used according to the invention, offer the advantage of being capable, by electron avalanche effect, of switching over between two states of electrical resistance, with low voltages and switching times that are relatively short as compared with the memories of the prior art. At the same time, they provide for greater integration (namely the quantity of pieces of logic data that can be stored per unit of volume).

The various research studies highlighting the properties of these materials are described in detail here below. By way of an illustrative example, these are works of research done for compounds meeting the formulae $NiS_{2-x}Se_x$ and $V_{2-x}Cr_xO_3$. Of course, the invention is not limited to these compounds alone but can be applied to any compound belonging to the family of centrosymmetric type Mott insulators, i.e. insulators having a crystallographic structure that possesses an inversion center. By way of examples, the invention can also be applied to the following compounds: the solid solution κ-(BEDT-TTF)$_2$Cu[N(CN)$_2$]Br$_x$Cl$_{1-x}$, the RNiO$_3$ series where R is a mixture of rare earths, the solid solution $V_{2-x}Al_xO_3$.

Figure 4:
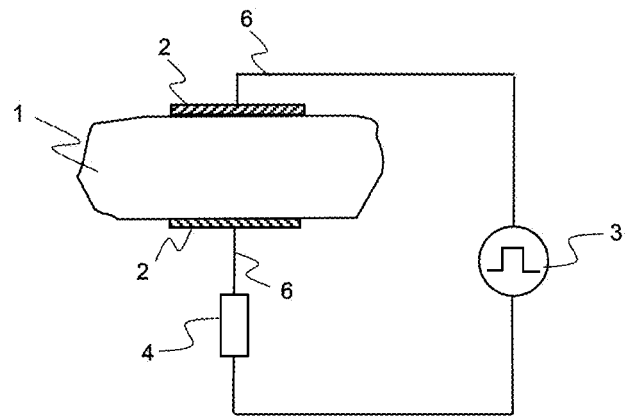
FIG. 4 illustrates diagrams of a Metal-Mott insulator-Metal type logic component incorporating an active material according to the invention.

FIG. 4 illustrates a diagram of the structure of a Metal-Mott insulator-Metal type logic component incorporating an active material 1 according to the invention. The active material 1 herein is a piece of crystal of a compound belonging to the family of centrosymmetric Mott insulators having a band gap at the Fermi level (such as for example $NiS_{1.89}Se_{0.11}$ or $V_{0.95}Cr_{0.05}O_3$) which has been preliminarily synthesized and then split. The piece of crystal 1 has for example the following typical dimensions: length 150 μm, width 150 μm and thickness 40 μm. Two metal electrodes 2 formed for example by means of a carbon lacquer are bonded to the piece of crystal 1. Two gold wires 6 connect the carbon lacquer to a voltage pulse source 3 and a load resistor 4 placed in series. This load resistor limits the current flowing within the active material 1 when this material is subjected to voltage pulses (or an electrical field). The metal electrodes 2 are spaced out from one another by about 40 μm. The material constituting the electrical electrodes and the active Mott insulator material is chosen so as to obtain work function values at the interfaces that are substantially identical, i.e. with a Fermi level that has substantially the same energy level. This enables easy and very fast switching between the two electrical resistance states, with low voltage levels.

The associated experimental electrical assembly diagram is illustrated in FIG. 5. The voltage (denoted as $V_{load}$) at the terminals of the load resistor (denoted as $R_{load}$) and the voltage at the terminals of the active material 1 (denoted as $V_{sample}$) are measured by means of differential probes and an oscilloscope. The voltage of the pulse is defined according to the relationship $V_{pulse}=V_{sample}+V_{load}$ and the resistance of the active material (denoted as $R_{sample}$) is calculated according to Ohms law: $R_{sample}=V_{sample}/I_{sample}$, where $I_{sample}=V_{load}/R_{load}$.

The logic component consists of a Metal-Mott insulator-Metal structure constituted by a piece of crystal 1 and two contact points situated on either side of the piece of crystal 1.

In one alternative application of the invention, it is possible to obtain a Metal-Mott insulator-Metal type structure, for example of the Au/NiS$_{1.89}$Se$_{0.11}$/Au type, using a method of thin-layer deposition on a substrate, for example a silicon substrate.

FIGS. 6a and 6b graphically illustrate the phenomenon of non-volatile and reversible resistive switching induced by voltage pulses obtained for the compound NiS$_2$ at 110K and at 300K respectively. The tests were made on a Metal-Mott insulator-Metal type structure incorporating the compound NiS$_2$ in two-point mode. Voltage pulses of +40V at 110 K and +15V at 300 K with a duration of some microseconds were applied to the logic components and the resistance of the material was measured after each pulse. A non-volatile variation of the resistance was observed after each pulse.

The curves show that the logic component incorporating the compound NiS$_2$ forms an elementary logic information cell containing at least three resistance states. Several resistive switching cycles were reproduced over time at 100 K and at 300 K without any fatigue effect of the material.

FIG. 6c represents the progress of the resistance of the compound NiS$_2$ as a function of the temperature before (curve referenced 7) and after (curve referenced 8) the switching of the active material. Here, the state of the material after switching possesses a nature different from its state before switching. The temperature dependence of the resistance of the material is different in the two states.

FIGS. 6d to 6h represents the progress in time of the voltage V$_{sample}$ (or electrical field E$_{sample}$) and of the current I$_{sample}$ measured at the terminals of the compounds NiS$_2$, NiS$_{1.89}$Se$_{0.11}$, NiS$_{1.79}$Se$_{0.21}$, NiS$_{1.70}$Se$_{0.30}$, NiS$_{1.63}$Se$_{0.37}$, as well as the corresponding current-voltage characteristics.

The tests were made on a Metal-Mott insulator-Metal type structure incorporating the compounds NiS$_2$, NiS$_{1.89}$Se$_{0.11}$, NiS$_{1.79}$Se$_{0.21}$, NiS$_{1.70}$Se$_{0.30}$, NiS$_{1.63}$Se$_{0.37}$ series-mounted with the following resistors: R$_{load}$ (NiS$_2$)=500Ω, R$_{load}$ (NiS$_{1.89}$Se$_{0.11}$)=500Ω, R$_{load}$ (NiS$_{1.79}$Se$_{0.21}$)=500Ω, R$_{load}$ (NiS$_{1.70}$Se$_{0.30}$)=500Ω, R$_{load}$ (NiS$_{1.63}$Se$_{0.37}$)=1.2 kΩ. It is observed on these curves that, for each compound, the state after switching is defined by a voltage threshold value. More specifically, it is seen that the electrical field threshold value (E$_{thres}$), is value (E is equal to about 7 kV/cm for the compound NiS$_2$, 5 kV/cm for the compound NiS$_{1.89}$Se$_{0.11}$, 4 kV/cm for the compound NiS$_{1.70}$Se$_{0.21}$, 3 kV/cm for the compound NiS$_{1.70}$Se$_{0.30}$, 1.7 kV/cm for the compound NiS$_{1.63}$Se$_{0.37}$. In other words, the resistive switching induced by the electrical pulse is linked to an electrical field effect with the appearance of an electrical field threshold value beyond which the material switches over from a first state of electrical resistance to a lower state of electrical resistance to form an elementary logic information cell.

The inventors have discovered that the threshold value of the electrical field varies according to a relationship of power with the band-gap energy of the Mott compounds as shown by the study of the NiS$_{2-x}$Se$_x$ series of compounds. The characteristic shape of the curve I(V), the threshold value of the electrical field (of the order of some kV/cm) and the progress of this threshold value as a function of the band-gap energy of the NiS$_{2-x}$Se$_x$ compounds show that the volatile resistive switching of these compounds is related to a dielectric breakdown by electron avalanche effect. This avalanche effect or creation of electron-hole pairs through impact ionization leading to a multiplication of the carriers, well known in classic semi-conductors, was hitherto unknown for Mott insulators. Indeed, as can be seen in the graph of FIG. 6i, the progress of the threshold value of the electrical field (E$_{thres}$) as a function of the band-gap energy (E$_g$) for classic semi-conductors (such as GaSb, InAs, InP, GaAs, GaN, etc) is substantially the same as it is for compounds having the formula NiS$_{2-x}$Se$_x$.

It must be noted that the volatile and non-volatile character of the resistive transition depends essentially on the amplitude of the electrical field applied to the active material. FIGS. 6d to 6i here above highlight the phenomenon of volatile transition from a threshold electrical field. To obtain a non-volatile resistive transition (as in the case of FIGS. 6a and 6b), it is necessary to apply higher voltage pulses generating an electrical field higher than the threshold field for the compound considered.

It must also be noted that the inventors have discovered that the switching time decreases when the thickness of the active material decreases.

FIG. 7a graphically illustrates the phenomenon of non-volatile and reversible resistive switching induced by voltage pulses obtained for the compound V$_{\sim1.85}$Cr$_{\sim0.15}$O$_3$ at 293K. Tests were made on a monocrystal of the compound V$_{\sim1.85}$Cr$_{\sim0.15}$O$_3$ according to a Metal-Mott insulator-Metal geometry as described in FIG. 4. Voltage pulses of +80V and of −50V, with a duration of some tens of microseconds, were applied in alternation to the active material and the resistance of this material was measured after each pulse. A non-volatile variation of the resistance is observed after each pulse. As in the case of the NiS$_{2-x}$Se$_x$ compounds, the curve here shows that, under the effect of an electrical field, the compound V$_{\sim1.85}$Cr$_{\sim0.15}$O$_3$ forms a logic component capable of generating an information bit possessing either a high-resistance state (considered as a logic "1") or a low-resistance state (considered as a logic "0"). Several resistive switching cycles were reproduced at 293K without fatigue effect of the material.

In one alternative application of the invention, a Metal-Mott insulator-Metal type structure obtained by means of a method of thin-layer deposition advantageously, through the reduction of thickness of the active material, greatly lowers the switching voltage (for example to less than 2 V) and greatly reduces the duration of the pulses needed for the switching (for example to less than 100 ns).

FIG. 7b represents the progress of the resistance of the compound V$_{\sim1.85}$Cr$_{\sim0.15}$O$_3$ as a function of the temperature before (curve referenced 10) and after (curves referenced 11 and 12) the switching of the active material. Here the state of the material after switching is of a nature different from that of the state before switching. The curve 11 illustrates the resistive state after application of a first voltage pulse and the curve 12 illustrates the resistive state after application of a second voltage pulse. The curves 10, 11 and 12 represent three distinct states of resistance. This illustrates the possibility of creating an elementary information cell with at least three logic states, which is particularly interesting for example in the context of MEMRISTORs FIGS. 7c and 7d represent the progress in time of the voltage V$_{sample}$ (or electrical field E$_{sample}$) and of the current I$_{sample}$ measured at the terminals of the compounds V$_{\sim1.85}$Cr$_{\sim0.15}$O$_3$ and V$_{\sim1.94}$Cr$_{\sim0.06}$O$_3$, as well as the corresponding current-voltage characteristics. Tests were carried out on a Metal-Mott insulator-Metal type structure incorporating the above-mentioned compounds, the structure being placed in series with a load resistor according to the diagram of FIG. 4.

These curves also show that, for each compound, a volatile resistive transition appears for a given electrical threshold value ($E_{thres}$): about 2.2 kV/cm for the compound $V_{\sim 1.85}Cr_{\sim 0.15}O_3$, and about 3.8 kV/cm for the compound $V_{\sim 1.94}Cr_{\sim 0.06}O_3$ for a distance between electrodes of about 60 to 80 μm.

These electrical field threshold values have been entered in the graph illustrating the progress of the threshold electrical field as a function of the band-gap energy (see FIG. 7e). It is noted that the compound $V_{\sim 1.85}Cr_{\sim 0.15}O_3$, in the paramagnetic state has a band gap smaller than that of $V_{\sim 1.94}Cr_{\sim 0.06}O_3$, which is situated in the antiferromagnetic phase. It is seen in addition that the volatile resistive transition observed in the compounds $V_{2-x}Cr_xO_3$ has the same phenomenonology as that observed for the compounds $NiS_{2-x}Se_x$. In particular, the threshold electrical field develops as a function of the band-gap energy according to the universal law established for classic semiconductors and already seen in the context of tests conducted for Mott insulators meeting the formula $NiS_{2-x}Se_x$.

This discovery therefore establishes the fact that this electron avalanche property as well as its consequences are general to all centrosymmetric Mott insulators. The effect of the electrical field on these materials induces a dielectric breakdown by electron avalanche effect. This has the consequence of locally destroying the Mott insulating state and restoring a metallic state, causing the appearance of a resistive transition.

An exemplary embodiment of the invention proposes a material that can be used as an active material of a resistive switching memory for storing data that presents real prospects of industrial-scale exploitation.

An exemplary embodiment of the invention proposes a material that enables switching between at least two states of electrical resistance by application of electrical fields of relatively low amplitude.

An exemplary embodiment of the invention proposes a material that can be used to obtain switching times between at least two states of electrical resistance that are shorter than the switching times for the prior art memories described further above.

An exemplary embodiment of the invention proposes a material of this kind that increases the quantity of data stored per unit of volume.

Although the present disclosure has been described with reference to one or more examples, workers skilled in the art will recognize that changes may be made in form and detail without departing from the scope of the disclosure and/or the appended claims.

The invention claimed is:

1. A method comprising:
   placing a material configured in a centrosymmetric Mott-insulating regime and having an energy band gap at the Fermi level, said material between first and second electrical electrodes to form an active material of a resistive switching memory for storing data, the active material having an electronic avalanche effect such that application of an electrical field of a predetermined value to the first and second electrical electrodes forms, by the electronic avalanche effect in said material, an elementary information cell having at least two logic states; and
   switching the material between the at least two logic states comprising applying an electrical field to the first and second electrical electrodes using a power supply.

2. A resistive switching memory for storing data, comprising:
   first and second electrodes;
   a material configured in a centrosymmetric Mot-insulating regime and having an energy band gap at the Fermi level, said material being positioned between the first and second electrical electrodes to form an active material of a resistive switching memory, the active material having an electronic avalanche effect such that application of an electrical field of a predetermined value to the first and second electrodes forms, by the electronic avalanche effect in said material, an elementary information cell having at least two logic states; and
   a power supply configured to apply an electrical field to the first and second electrical electrodes to switch the material between the at least two logic states.

3. A method according to claim 1, said material belonging to a sub-family of inorganic compounds.

4. A method according to claim 1, comprising:
   choosing the chemical composition of the material so as to set an electrical field threshold value beyond which the material switches over from a first state of electrical resistance to one or more different states of electrical resistance to form the elementary information cell having at least two logic states.

5. A resistive switching memory according to claim 2, said material belonging to a sub-family of inorganic compounds.

6. A resistive switching memory according to claim 2, wherein said material is an organic compound in the form of a solid solution $\kappa\text{-}(BEDT\text{-}TTF)_2Cu[N(CN)_2]Br_xCl_{1-x}$ ($0 \leq x \leq 1$).

7. A resistive switching memory according to claim 2, wherein the chemical composition of the material comprises an electrical field threshold value beyond which the material switches over from a first state of electrical resistance to one or more different states of electrical resistance to form the elementary information cell having at least two logic states.

8. A method according to claim 1, wherein the Fermi level is placed between an upper Hubbard band and a lower Hubbard band of the active material.

9. A resistive switch according to claim 2, wherein the Fermi level is placed between an upper Hubbard band and a lower Hubbard band of the active material.

10. A method according to claim 1, wherein the material comprises a compound meeting the formula $NiS_{2-x}Se_x$, with $0.00 \leq x \leq 0.59$.

11. A method according to claim 1, wherein the material comprises a compound meeting the formula $V_{2-x}M_xO_3$, with $0.02 \leq x \leq 0.50$ and with M comprising at least one of the following elements or a combination of these elements: Ti, Cr, Fe, Al or Ga.

12. A resistive switch according to claim 2, wherein the material comprises a compound meeting the formula $NiS_{2-x}$Se, with $0.00 \leq x \leq 0.59$.

13. A resistive switch according to claim 2, wherein the material comprises a compound meeting the formula $V_{2-x}M_xO_3$, with $0.02 \leq x \leq 0.50$ and with M comprising at least one of the following elements or a combination of these elements: Ti, Cr, Fe, Al or Ga.

14. A method comprising:
   placing a material configured in a centrosymmetric Mott-insulating regime and having an energy band gap at the Fermi level, said material between first and second electrical electrodes to form an active material of a resistive switching memory for storing data, the active material having an electronic avalanche effect such that application of an electrical field of a predetermined value to the first and second electrical electrodes forms, by the electronic avalanche effect in said material, an elementary information cell having at least two logic states;

wherein said material comprises one of:
a compound meeting the formula $NiS_{2-x}Se_x$, with $0.00 \leq x \leq 0.59$; and
a compound meeting the formula $V_{2-x}M_xO_3$, with $0.02 \leq x \leq 0.50$ and with M comprising at least one of the following elements or a combination of these elements: Ti, Cr, Fe, Al or Ga.

15. A method according to claim 14, comprising choosing the chemical composition of the material so as to set an electrical field threshold value beyond which the material switches over from a first state of electrical resistance to one or more different states of electrical resistance to form the elementary information cell having at least two logic states.

16. A method according to claim 14, wherein the Fermi level is placed between an upper Hubbard band and a lower Hubbard band of the active material.

17. A resistive switching memory for storing data, comprising:
first and second electrodes;
a material configured in a centrosymmetric Mott-insulating regime and having an energy band gap at the Fermi level, said material being positioned between the first and second electrical electrodes to form an active material of a resistive switching memory, the active material having an electronic avalanche effect such that application of an electrical field of a predetermined value to the first and second electrodes forms, by the electronic avalanche effect in said material, an elementary information cell having at least two logic states;

wherein said material comprises one of:
a compound meeting the formula $NiS_{2-x}Se_x$, with $0.00 \leq x \leq 0.59$; and
a compound meeting the formula $V_{2-x}M_xO_3$, with $0.02 \leq x \leq 0.50$ and with M comprising at least one of the following elements or a combination of these elements: Ti, Cr, Fe, Al or Ga.

18. A resistive switching memory according to claim 17, said material belonging to a sub-family of inorganic compounds.

19. A resistive switching memory according to claim 17, wherein the chemical composition of the material comprises an electrical field threshold value beyond which the material switches over from a first state of electrical resistance to one or more different states of electrical resistance to form the elementary information cell having at least two logic states.

20. A resistive switch according to claim 17, wherein the Fermi level is placed between an upper Hubbard band and a lower Hubbard band of the active material.

* * * * *